(12) United States Patent
Steinbrenner et al.

(10) Patent No.: US 9,455,136 B2
(45) Date of Patent: Sep. 27, 2016

(54) CONTROLLING THE REFLOW BEHAVIOUR OF BPSG FILMS AND DEVICES MADE THEREOF

(71) Applicant: Infineon Technologies Austria AG, Villach (AT)

(72) Inventors: Juergen Steinbrenner, Noetsch (AT); Markus Kahn, Rangersdorf (AT); Helmut Schoenherr, Villach (AT); Ravi Joshi, Villach (AT); Heimo Hofer, Bodensdorf (AT); Martin Poelzl, Ossiach (AT); Harald Huetter, Baldramsdorf (AT)

(73) Assignee: Infineon Technologies Austria AG, Villach (AU)

( * ) Notice: Subject to any disclaimer, the term of this patent is extended or adjusted under 35 U.S.C. 154(b) by 0 days.

(21) Appl. No.: 14/603,943

(22) Filed: Jan. 23, 2015

(65) Prior Publication Data
US 2016/0218002 A1    Jul. 28, 2016

(51) Int. Cl.
*H01L 21/336* (2006.01)
*H01L 21/02* (2006.01)
(Continued)

(52) U.S. Cl.
CPC ... *H01L 21/02129* (2013.01); *H01L 21/02208* (2013.01); *H01L 21/02211* (2013.01); *H01L 21/02271* (2013.01); *H01L 21/02318* (2013.01); *H01L 21/76831* (2013.01);
(Continued)

(58) Field of Classification Search
CPC ............... H01L 29/7802; H01L 29/66712; H01L 29/1095; H01L 29/7813

USPC .......... 438/268, 435, 436; 118/712
See application file for complete search history.

(56) References Cited

U.S. PATENT DOCUMENTS 5,310,720 A * 5/1994 Shin ............ H01L 21/316
257/E21.243
5,314,848 A   5/1994 Yasui et al.
(Continued)

FOREIGN PATENT DOCUMENTS

EP         0635888 A1 *  1/1995  ....... H01L 21/02238
EP         0635888 B1     3/2006

OTHER PUBLICATIONS

Belyansky, M., et al., "Low Temperature Borophosphosilicate Glass (BPSG) Process for High Aspect Ratio Gap Fill," www.electrochem.org/dl/ma/201/pdfs/0705.pdf., downloaded Oct. 6, 2014, 1 page.
(Continued)

*Primary Examiner* — Mohammed Shamsuzzaman
(74) *Attorney, Agent, or Firm* — Slater Matsil, LLP

(57) ABSTRACT

A method for depositing an insulating layer includes performing a primary deposition over a sidewall of a feature by depositing a layer of silicate glass using a silicon source at a first flow rate and a dopant source at a second flow rate. A ratio of the flow of the dopant source to the flow of the silicon source is a first ratio. The method further includes performing a secondary deposition over the sidewall of a feature by increasing the flow of the silicon source relative to the flow of the dopant source. The ratio of the flow of the dopant source to the flow of the silicon source is a second ratio lower than the first ratio, and stopping the flow of the silicon source after performing the secondary deposition. A reflow process is performed after stopping the flow. A variation in thickness of the layer of silicate glass over the sidewall of a feature after the reflow process is between 1% to 20%.

24 Claims, 8 Drawing Sheets

(51) Int. Cl.
*H01L 21/768* (2006.01)
*H01L 23/528* (2006.01)
*H01L 23/532* (2006.01)
*H01L 29/06* (2006.01)

(52) U.S. Cl.
CPC ........ *H01L 23/528* (2013.01); *H01L 23/5329* (2013.01); *H01L 29/0649* (2013.01)

(56) References Cited

U.S. PATENT DOCUMENTS

| | | | | |
|---|---|---|---|---|
| 6,069,058 | A * | 5/2000 | Hong | H01L 21/76237 257/E21.551 |
| 6,072,227 | A * | 6/2000 | Yau | C23C 16/401 257/635 |
| 6,136,685 | A * | 10/2000 | Narwankar | C23C 16/401 257/E21.276 |
| 6,177,344 | B1 * | 1/2001 | Xia | H01L 21/31051 257/E21.241 |
| 6,218,268 | B1 * | 4/2001 | Xia | C23C 16/045 257/E21.275 |
| 6,890,833 | B2 * | 5/2005 | Belyansky | H01L 21/76224 257/E21.546 |
| 7,955,993 | B2 * | 6/2011 | Lan | H01L 21/02129 257/E21.159 |
| 2003/0017267 | A1 * | 1/2003 | Mukai | C23C 16/401 427/255.28 |
| 2003/0019427 | A1 * | 1/2003 | Ghanayem | C23C 16/401 118/712 |
| 2004/0166695 | A1 * | 8/2004 | Yuan | C23C 16/401 438/788 |
| 2005/0085042 | A1 * | 4/2005 | Chun | H01L 21/76229 438/275 |
| 2007/0215875 | A1 * | 9/2007 | Han | H01L 21/823481 257/57 |
| 2009/0179261 | A1 * | 7/2009 | Sekiguchi | H01L 21/2855 257/330 |
| 2010/0151668 | A1 * | 6/2010 | Yoon | H01L 21/02129 438/587 |
| 2012/0231605 | A1 * | 9/2012 | Kim | H01L 21/76224 438/424 |

OTHER PUBLICATIONS

Jagadeesha, T., et al., "Innovative low pressure borophosphosilicate glass processes for nano devices," Indian Journal of Engineering & Materials Sciences, vol. 16, Oct. 2009, pp. 341-346.

Kusters, K.H., et al., "A Self Aligned Contact Process with Improved Surface Planarization," Journal De Physique, C4-503, Sep. 1988, 4 pages.

Nguyen, S. V., "High-Density plasma chemical vapor deposition of silicon based dielectric films for integrated circuits," Journal of Research & Development, vol. 43, No. 1/2, Jan. 1999, 19 pages.

\* cited by examiner

CONTROLLING THE REFLOW BEHAVIOUR OF BPSG FILMS AND DEVICES MADE THEREOF

TECHNICAL FIELD

The present invention relates generally to electronic devices, and, in particular embodiments, to controlling the reflow behaviour of BPSG films and devices made thereof.

BACKGROUND

Semiconductor scaling has resulted in device with very small features and increased complexity. Many integrated circuits now have features, such as traces or trenches that are significantly less than a micron across. While the reduction in feature size has allowed higher device density, more complex circuits, lower operating power consumption and lower cost, the smaller geometries have also given rise to new problems, or have resurrected problems that were once solved for larger geometries.

Silicon oxide is used as an insulating layer in many such applications. For example, silicon oxide is frequently used as pre-metal dielectric (PMD) layer below the metallization layer and above the active device regions. Such a PMD layer is deposited over a gate line below the metal lines.

Silicon oxide is typically deposited by thermal oxidation or by using a chemical vapor deposition (CVD) process or plasma enhanced CVD process. In a CVD process, a silicon containing gas is made to react with an oxygen containing gas resulting in the formation of the silicon oxide. Reaction rates and therefore the rate of deposition of a CVD process can be controlled using a combination of the temperature, pressure, reactant gas flow rates, and plasma power. The CVD processes result in the formation of silicon oxide, which is heated to form a silicate glass layer. The reflow of the deposited silicon oxide results in smoothing of the deposited oxide.

Boron and phosphorus are introduced into the silicate glass layers to form a doped silicate glass (BPSG) to improve the reflow and gettering behavior of the BPSG films. However, manufacturing with BPSG still poses many issues depending on the desired application. One example of a manufacturing challenge is the excessive reflow of the BPSG films, for example, resulting in difficulty to form proper contacts between dense pitched gate lines. Another example is the ability to completely fill a narrow trench in a void-free manner while keeping the thermal budget of the trench-filling process at a minimum.

SUMMARY

In accordance with an embodiment of the present invention, a method for depositing an insulating layer comprises performing a primary deposition over a sidewall of a feature by depositing a layer of silicate glass using a silicon source at a first flow rate and a dopant source at a second flow rate. A ratio of the flow of the dopant source to the flow of the silicon source is a first ratio. The method further comprises performing a secondary deposition over the sidewall of a feature by increasing the flow of the silicon source relative to the flow of the dopant source. The ratio of the flow of the dopant source to the flow of the silicon source is a second ratio lower than the first ratio, and stopping the flow of the silicon source after performing the secondary deposition. A reflow process is performed after stopping the flow. A variation in thickness of the layer of silicate glass over the sidewall of a feature after the reflow process is between 1% to 20%.

In accordance with an embodiment of the present invention, a method for depositing an insulating layer includes performing a primary deposition by depositing a layer of silicate glass using a silicon source at a first flow rate and a dopant source at a second flow rate. A ratio of the flow of the dopant source to the flow of the silicon source is a first ratio. The method further comprises performing a secondary deposition by increasing the flow of the silicon source relative to the flow of the dopant source. The ratio of the flow of the dopant source to the flow of the silicon source is a second ratio lower than the first ratio. The primary deposition is performed for a first time duration and the secondary deposition is performed for a second time duration. The second time duration is less than the first time duration, wherein the first time duration is between 8 s to 300 s, and wherein the second time duration is greater than 3 s. The method further comprises stopping the flow of the silicon source after performing the secondary deposition.

In accordance with an embodiment of the present invention, a method of forming a device comprising an insulation layer includes providing a first wafer comprising a first feature, and depositing a layer of insulation over the first feature using a first process recipe of a deposition process comprising a deposition step followed by a termination step. The deposition step comprises using a silicon source, oxygen source, and a dopant source, wherein the dopant source is switched off during the termination step. The method further includes annealing the first wafer to reflow the layer of insulation. During the annealing, a material of the layer of insulation reflows at a first reflow rate at the first feature. The method further includes changing the first process recipe for the deposition process to a second process recipe, and providing a second wafer comprising a second feature. The method further includes depositing an insulation layer over the second feature using the second process recipe of the deposition process comprising the deposition step followed by the termination step. A time for the termination step in the second process recipe is greater than a time for the termination step in the first process recipe. The method further includes annealing the second wafer to reflow the insulation layer. During the annealing, a material of the insulation layer reflows at a second reflow rate, and the second reflow rate is smaller than the first reflow rate.

In another embodiment of the present invention, a semiconductor device comprises a structure comprising sidewalls, and a reflown insulating layer disposed over the sidewalls of the structure. A thickness of the reflown insulating layer varies along the sidewall by 1% to 10%.

In another embodiment of the present invention, a method for forming a borophosphosilicate glass (BPSG) film comprises depositing a layer of BPSG using tetraethylorthosilane (TEOS) and a first dopant source using a first process parameter set for a first process time. A ratio of a flow of the first dopant source to a flow of the TEOS is a first ratio. The method further includes increasing the flow of the TEOS relative to the flow of the first dopant source using a second parameter set for a second process time by reducing the flow of first dopant source by at least 50% and increasing the flow of TEOS by at least 10%. The ratio of the flow of the first dopant source to the flow of the TEOS is a second ratio lower than the first ratio. The depositing is performed for a first time duration and the increasing is performed for a second time duration. The second time duration is less than the first time duration. The first time duration is between 8 s to 300 s, and wherein the second time duration is greater than 3 s. The method further includes stopping the deposition of the BPSG film after increasing the flow.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A illustrates a schematic of a process chamber, wherein

FIGS. 3A and 3B illustrates a cross-sectional view of a BPSG film after deposition and reflow using embodiments of the present invention, wherein FIG. 3B illustrates a magnified view of a portion of FIG. 3A;

FIGS. 5A and 5B illustrate a schematic cross section of a patterned structure comprising a conformal BPSG film spacer formed using the embodiment of FIG. 2 in accordance with an embodiment of the present invention, wherein FIG. 5A illustrates the conformal BPSG film while FIG. 5B illustrates the spacer;

DETAILED DESCRIPTION OF ILLUSTRATIVE EMBODIMENTS

Figure 1A:
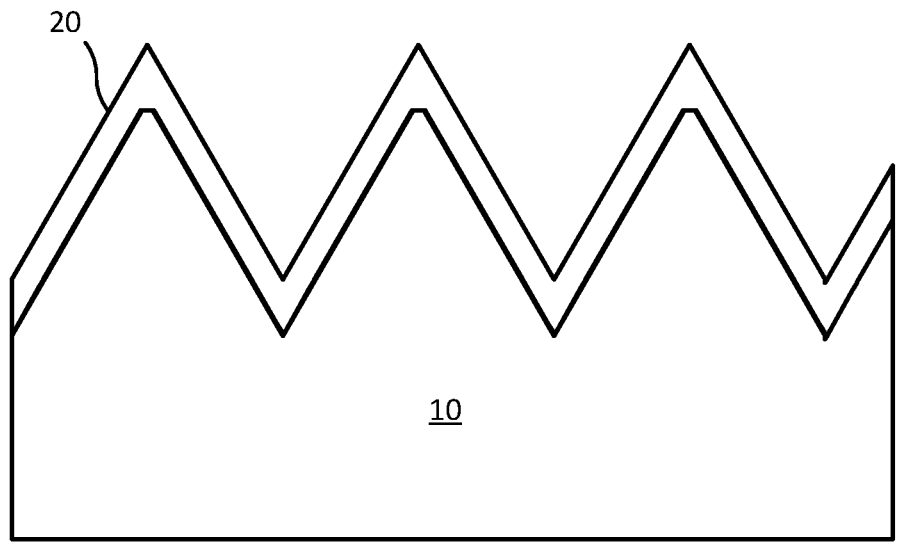
FIG. 1A illustrates a conventional borophosphosilicate glass (BPSG) film deposited over a substrate using a prior art process.

FIG. 1A illustrates a conventional borophosphosilicate glass (BPSG) film 20 deposited over a substrate 10 using a prior art process. BPSG is used in the semiconductor industry as a separation layer, for example, between the polysilicon gate/interconnect layer and the first metal layer of transistors. Such a separation layer is often referred to as pre-metal dielectric (PMD) layer because it is deposited before any metal layer of the back end metallization is deposited. The PMD layer is used to electrically isolate portions of the first deposited metal layer from the semiconductor substrate. Conventional processes strive to achieve good planarization and gap-fill characteristics for the deposited BPSG film 20.

Accordingly, deposition methods have been developed to meet these characteristics and often include planarizing of the layer by heating it above its reflow temperature so that the deposited BPSG film 20 flows as a liquid. The reflow process enables the BPSG film 20 to fill trenches of small width with high-aspect ratio.

Heating used to reflow the BPSG film 20 can be achieved using either rapid thermal processing (RTP) or a conventional furnace in either a dry (e.g., $N_2$ or $O_2$) or wet (e.g., steam $H_2/O_2$) ambient.

A conventional BPSG film 20 may be formed by introducing a phosphorus-containing source and a boron-containing source into a processing chamber along with silicon- and oxygen-containing sources. Triethylphosphate (TEPO), triethylphosphite (TEPi), trimethylphosphate (TMOP), trimethylphosphite (TMPi), and similar compounds may be used a source for phosphorus. Similarly, Trietbylborate (TEB), trimethylborate (TMB), and similar compounds may be used as a source for boron.

In general, doped oxides which exhibit reflow behavior have a combined total doping of phosphorus and boron in the range of 4 to 9%. Typically boron, in contrast to phosphorus, is the driving agent for the reflow properties. Silicon dioxide with higher phosphorous concentration is used to facilitate smoothing but is detrimental to the metallization, because of aluminum corrosion. After the doped silicon oxide is deposited, a subsequent heating is necessary until the oxide softens and flows.

In addition to the boron concentration, the reflow morphology of the doped silicon dioxide can also be determined by heating temperature, heating time, heating rate, and heating ambient. In addition, the content or amount of boron (1 bis 5%) is a deciding factor for the reflow properties, as it reduce the softening temperature by decreasing the glass viscosity.

Figure 1B:
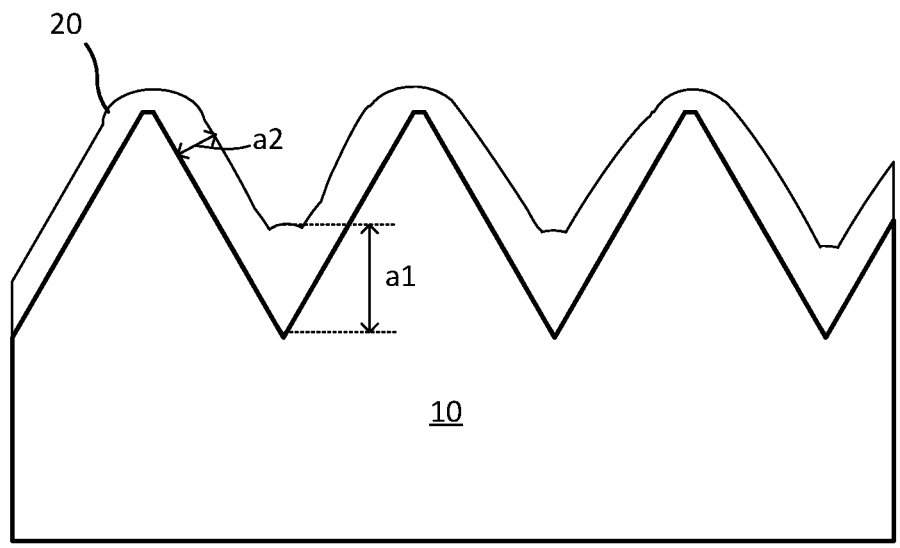
FIG. 1B illustrates the reflowed BPSG film after a reflow process using a prior art process.

FIG. 1B illustrates the reflowed BPSG film 20R after a reflow process. As is illustrated in FIG. 1B, the reflow process smoothens the upper surface of the deposited BPSG film 20. Further, when deposited on a textured surface (surface having uneven or patterned surface orientations), the smoothening process modulates the thickness of the BPSG film 20. For example, the reflown BPSG film 20R may be thicker at the bottom of the openings than at the top surface. In a conventional process, the thickness of the reflown BPDG film 20R at the bottom portion of the sidewall is at least 20% thicker than at a top portion of the sidewall, i.e, a1>1.2×a2.

The reflow process also provides other important functions. During the reflow, metal ions in the underlying substrate are gettered by the BPSG film 20. For example, sodium atoms in the substrate are gettered into the BPSG film 20 during the reflow process. Further, the etch rate of the BPSG film 20 may have to be adjusted if the reflow process is changed.

Conventional processes use the concentrations of boron and phosphorus to improve the reflow and the gettering of mobile ions. For instance, the boron and phosphorus content are adjusted to change the reflow, the gettering rate, and the etch rate.

However, too much reflow is not suitable for some applications, which require a conformal film. Reducing the reflow using conventional techniques may also reduce the effectiveness of the dopant gettering provided by the BPSG film while changing the etch rate in the wrong direction. For example, reducing the thermal budget of the reflow process is one way to reduce the reflow. However, reducing the thermal budget would also reduce the gettering of the mobile ions. Therefore, an independent way to change the reflow is an attractive solution.

Another conventional way to change the reflow behavior involves depositing another undoped capping layer. However, such a process changes the thickness of the BPSG film that needs to be etched. The etching process becomes more complicated especially because the etching rates are different in the undoped capping layer and the underlying doped film. Increasing the thickness of the BPSG film may also introduce other problems during fabrication.

Therefore, prior art techniques cannot produce a film having a desirable reflow, gettering, and etch process complexity and without changing the film thickness significantly.

Embodiments of the present invention overcome these limitations by providing a termination step for the deposition process that is designed to reduce the reflow process without impacting the etching process and gettering properties of the film. Accordingly, in various embodiments, during the BPSG deposition itself, the termination step is modified such that dopant flow is reduced or stopped before stopping the silicon source. The time of the termination step is modified from prior art techniques to enable this modification. In alternative embodiments, the termination step may also be performed ex-situ although it may not be cost effective. Also, in another alternative, a thin plasma oxide on the top of BPSG may be deposited using a plasma process in the same chamber. For example, plasma quality may also be used to change the reflow behavior.

In prior art processes, the deposition process is followed by a short termination process. The termination step is designed so that dopant flow is first stopped before stopping the silicon source. Thus, the few monolayers of the BPSG film at the exposed surface have a reduced dopant concentration, which is helpful to avoid moisture absorption.

In various embodiments, the termination step is modified to become a secondary deposition process in which a thin layer of insulation material is deposited during the termination step. The thin layer of the insulation material is sufficient to modify the reflow process but does not modify the gettering process and change the etching rate of the deposited film.

A method of forming a BPSG film in accordance with embodiments of the present invention will be described using FIG. 2. Structural devices formed using the method will be described using FIGS. 3-7.

Figure 2A:
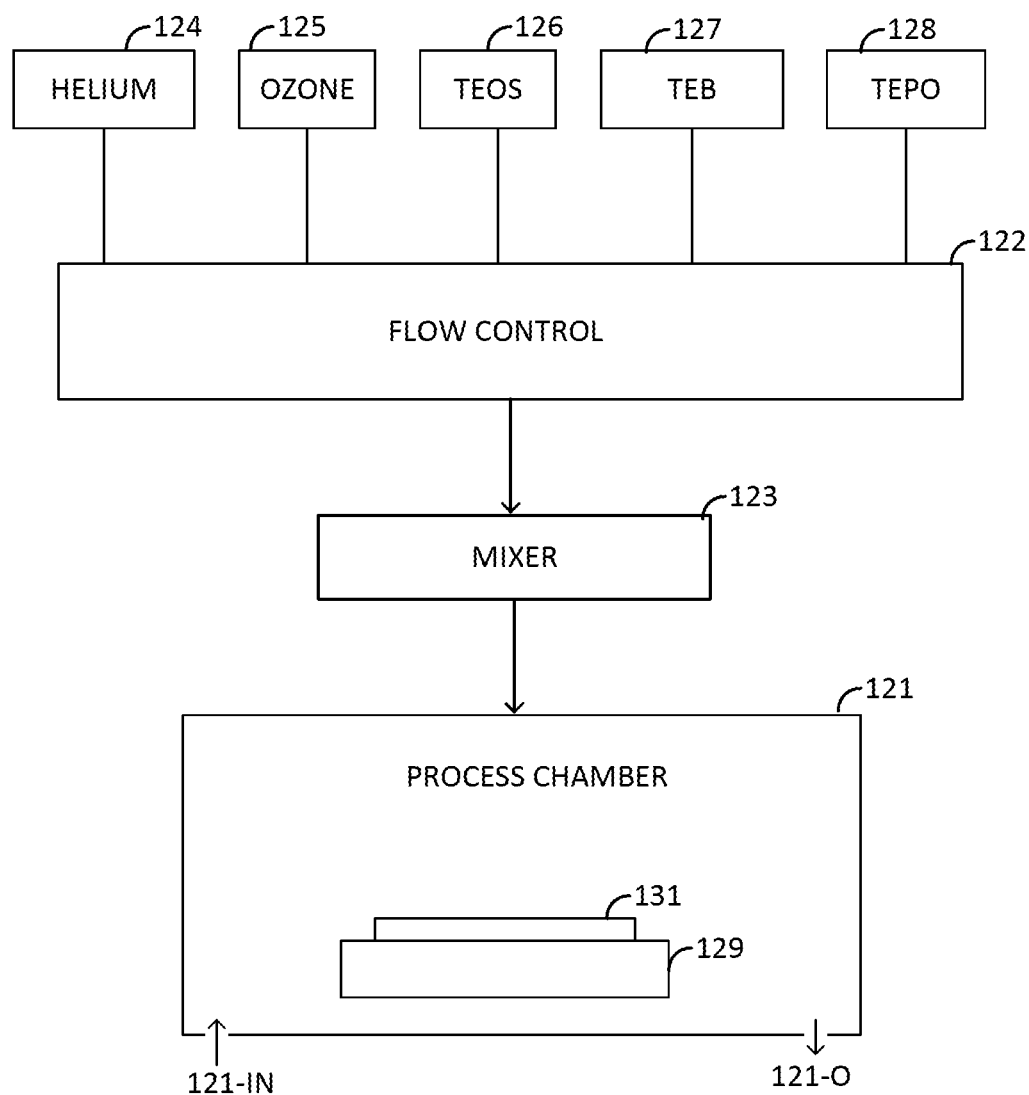
Figure 2B:
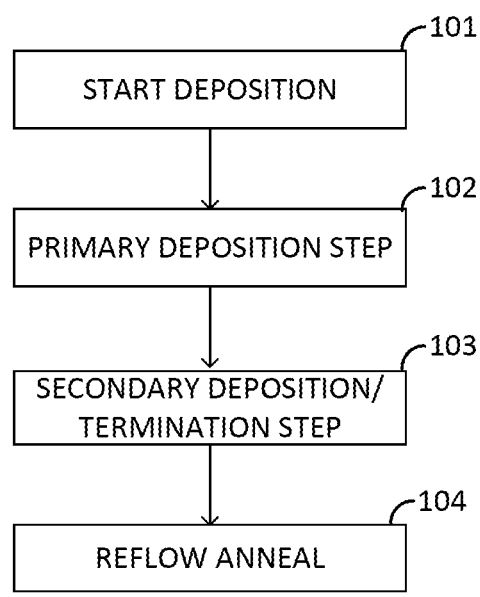
FIG. 2B illustrates a schematic process flow in accordance with an embodiment of the present invention.

FIG. 2A illustrates a schematic of a process chamber. FIG. 2B illustrates a schematic process flow in accordance with an embodiment of the present invention.

FIG. 2A is a simplified diagram of a chemical vapor deposition (CVD) system used in accordance with an embodiment of the present invention. In one or more embodiments, the CVD system may be a sub-atmospheric CVD (SA-CVD) system and used to process the wafer 131.

In various embodiments, all operations illustrated in FIG. 2A are performed within the process chamber 121 of the SA-CVD system. In one or more embodiments, all the operations of FIG. 2A may be performed prior to removing the wafer 131 from the chuck 129.

The SA-CVD system includes a vacuum chamber within the process chamber 121 for receiving the process gas to be deposited onto the wafer 131. The SA-CVD system further includes a flow control 122 to control the flow of gases into the process chamber 121 and a mixer 123 to mix the gases before sending into the process chamber 121. In some embodiments, the mixer 123 may be skipped and the gases may be directly introduced in to the process chamber 121.

The process chamber 121 may be heated to ensure that the reaction is triggered only within the process chamber 121 and not within the mixer 123. Accordingly, in some embodiments, the wafer 131 may be heated by the chuck 129, which may include a heating element. Alternatively, a separate heating element may be provided.

The process chamber 121 may include a plurality of inlets to receive the gases from the mixer 123. The process chamber 121 may include a plurality of sensors to obtain information regarding position of the wafer 131, alignment of the wafer 131 (if necessary), temperature of the wafer 131, and other information needed to control the deposition process.

The process chamber 121 may also be coupled to a plasma generating chamber in some embodiments. For example, in some embodiments, one or more sources may be ionized before introduction into the process chamber 121. In such cases, the ionized precursor may be introduced from the plasma generating chamber.

The process chamber 121 may include inlet outlets 121-IN and exit outlets 121-O for providing purge gases and other gases needed for cleaning the process chamber 121 as needed. As such, the SA-CVD system may include any features as in conventional systems.

The SA-CVD system may include a plurality of gas sources. A carrier gas such as helium 124 may be used in various embodiments. An oxidizing source such as ozone 125 may be used as the oxidizing species. In other embodiments, other oxidizing sources may be used including oxygen, $N_2O$, and NO. In one exemplary embodiment, a source of TEOS 126 is used for the silicon source. Alternatively, silane based chemistry may be used in some embodiments. Dopant sources may comprise TEB 127 and TEPO 128 as examples.

Supply lines from the sources provide reactive gases and carrier gases to the flow control 122. The flow control 122 is configured to regulate the flow of each of the individual sources. The flow control 122 may include sensors, shut-off valves, mass flow controllers in various embodiments. In various embodiments, the flow control 122 may comprise any type of controller for measuring and regulating the flow of gas or liquid through the supply lines.

In some embodiments, the mixer 123 may include a liquid injection system for vaporizing reactant liquids such as TEOS 126, TEB 127, and TEPO 128. The vaporized sources may be combined with the carrier gas (helium 124). The flow from ozone 125 may be directly introduced into the process chamber 121 without mixing in some embodiments to avoid any reaction prior to reaching the process chamber 121. Alternatively, the ozone 125 may be combined with the reactive mixture just prior to entering the process chamber 121.

In one illustration, a mixture comprising TEOS 126 as a silicon source, TEB 127 as a boron source, and TEPO 128 as a phosphorus source may be mixed in the mixer 123. As TEOS 126 and TEPO 128 are liquid sources, they may be first vaporized before mixing with TEB 127. The vaporization may be performed using a boiler or other heating methods. As another alternative, the liquids may be directly injected as a fine spray or mist into the helium carrier gas and heated.

Referring to FIG. 2B, in box 101, the deposition is started. After any necessary clean operation, the wafer 131 is loaded into the process chamber 121 and the process chamber 121 is pressurized and heated. For example, the process chamber may be pressurized to 100 Torr to 500 Torr, for example, to 200 Torr in one example. The wafer 131 may be heated to about 400° C., for example, between 400° C. to 500° C. A chamber purge may be performed if needed.

Accordingly, referring to FIG. 2A, the reactive gases from the mixer 123 along with the oxidizing gas (ozone 125) are introduced into the process chamber 121 after the process chamber 121 is pressurized to appropriate pressure and the wafer 131 is brought to the deposition temperature.

Referring to box 102, the primary deposition step causes a layer of BPSG film to be deposited over the exposed surface of the wafer 131. The primary deposition step may be performed so as to deposit a highly doped BPSG film having a good conformity. In various embodiments, the primary deposition step may comprise using a helium flow rate between 10,000 to 20,000 sccm, ozone flow rate between 5000 to 10,000 sccm, TEOS flow rate between 1000 to 2000 mgm, TEB flow rate between 200 to 800 mgm, TEPO flow rate between 100 to 200 mgm.

The primary deposition may be performed for 10 s to 500 s depending on the thickness being deposited and also the selected process conditions. Additionally, the primary deposition results in depositing a BPSG film having a thickness of about 20 nm to 400 nm, for example, 40 nm to 100 nm in one embodiment.

Referring next to box 103, once the primary deposition is completed, a second deposition is performed. The secondary deposition may be a termination step in one or more embodiments. During this step, the dopants sources are cut-off or markedly reduced.

The secondary deposition step may be performed so as to deposit an un-doped film having a good conformity. In various embodiments, the secondary deposition step may comprise using a helium flow rate between 10,000 to 20,000 sccm, ozone flow rate between 5000 to 10,000 sccm, TEOS flow rate between 1050 to 2050 mgm, and no flow of TEB and TEPO.

In various embodiments, the TEOS flow rate during the secondary deposition step is higher than the TEOS flow rate during the primary deposition step. In one or more embodiments, the TEOS flow rate during the secondary deposition step is at least 5% higher than the TEOS flow rate during the primary deposition step. In one or more embodiments, the TEOS flow rate during the secondary deposition step is at least 5% to 20% higher than the TEOS flow rate during the primary deposition step.

In various embodiments, the TEB and TEPO flow rates during the second deposition step is at least 50% lower than the corresponding TEB and TEPO flow rates during the primary deposition step. In one exemplary embodiment, the TEB and TEPO flow rates during the second deposition step is 0% to 1%, i.e., negligible.

However, the ratio of TEOS to TEB and TEPO is a more important parameter. Accordingly, the ratio of the TEOS to TEB and of TEOS and TEPO during the primary deposition step is higher than the corresponding ratio of the TEOS to TEB and of TEOS and TEPO during the secondary deposition step. Consequently, the TEOS flow rate may be increased in the secondary deposition step without cutting off the boron and phosphorus sources in one embodiment. In one exemplary embodiment, the TEPO and TEB are turned off during the secondary deposition step.

The secondary deposition may be performed for 3 s to 20 s depending on the thickness being deposited and also the selected process conditions. In one or more embodiments, secondary deposition may be performed for 4 s to 8 s, and about 6 s in one example. In various embodiments, in order to hinder the reflow of the BPSG, thickness of film deposited during the secondary deposition, i.e., termination layer, may not be dependent on the BPSG thickness.

In various embodiments, during the secondary deposition, an undoped insulating film having a thickness of about 3 nm to 6 nm is deposited over the doped BPSG film deposited during the primary deposition step. In one or more embodiments, the undoped insulating film having a thickness of about 5 nm to 6 nm is deposited over the doped BPSG film deposited during the primary deposition step. In one or more embodiments, the undoped insulating film is more than a few mono-layers.

After the secondary deposition process, the flow of TEOS is shut off so that no more deposition may occur. Additionally, a purge process may be performed if deemed necessary. The wafer 131 may be removed from the process chamber 121 in preparation for the subsequent reflow anneal. In some embodiments, the reflow anneal may also be performed in the same process chamber 121.

Referring next to box 104, a reflow anneal is performed. The reflow anneal may be performed at a temperature between 600° C. to 1000° C. in various embodiments. If the thermal budget of the deposition steps described above are sufficient to reflow and getter mobile ions, the reflow anneal may be skipped in some embodiments.

Figure 3A:
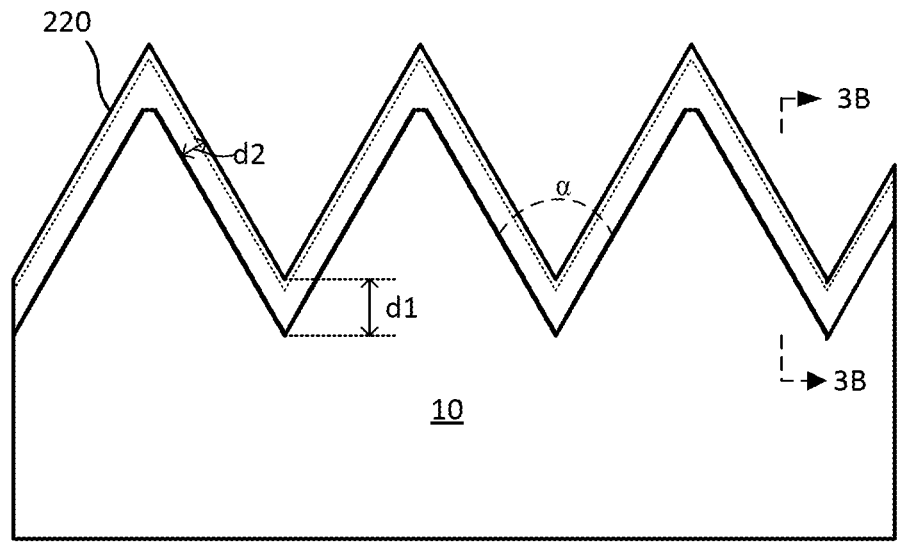
Figure 3B:
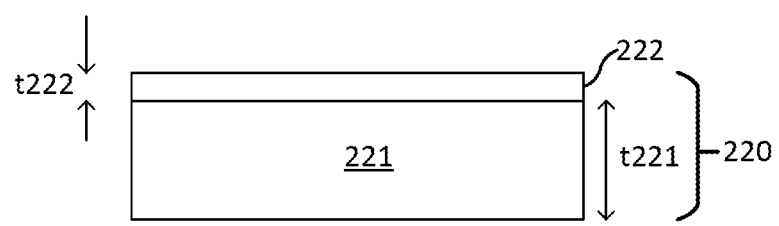

FIGS. 3A and 3B illustrates a cross-sectional view of a BPSG film 220 after deposition and reflow using embodiments of the present invention. FIG. 3B illustrates a magnified view of a portion of FIG. 3A.

Referring to FIG. 3A, a BPSG film 220 is deposited over a substrate 10 and reflowed as described in FIG. 2. FIG. 3B illustrates a magnified view and shows the doped film 221 having a first thickness t221 followed by the undoped film 222 having a second thickness t222. In various embodiments, the first thickness is at least 10 times the second thickness t222. In one or more embodiments, the first thickness t221 is about 50 nm to about 60 nm while the second thickness t222 is between about 5 nm to 6 nm.

Because of the use of the secondary deposition step, the BPSG film 220 does not reflow significantly during the reflow anneal, for example, in contrast to FIG. 1B showing a conventional film after the reflow process.

The textured surface comprises a top surface comprising ridges intersecting at an angle less than 60° in one embodiment. A thickness of the BPSG film after a reflow process varies over the top surface by not more than 10% of the thickness of the BPSG film at any other point. In one embodiment, a variation in thickness of the BPSG film on the sidewalls after the reflow process is between 1% to 20%.

Accordingly, the first depth d1 at the narrow acute vertices is within 5% of the second depth d2 at the other regions of the BPSG film 220 even though the surface of the substrate 10 may include planes inclined at an angle α less than 60°, for example, between 30° to 45° in one embodiment. In various embodiments, variation in thickness of the first depth d1 from the second depth d2 is less than 20%. In one or more embodiments, variation in thickness of the first depth d1 from the second depth d2 is between 1% and 20%. In one or more embodiments, variation in thickness of the first depth d1 from the second depth d2 is between 0.1% and 10%. In one or more embodiments, variation in thickness of the first depth d1 from the second depth d2 is between 5% and 10%. Accordingly, a reflow insulation layer is formed having minimal variation due to the limited reflow.

Figure 4:
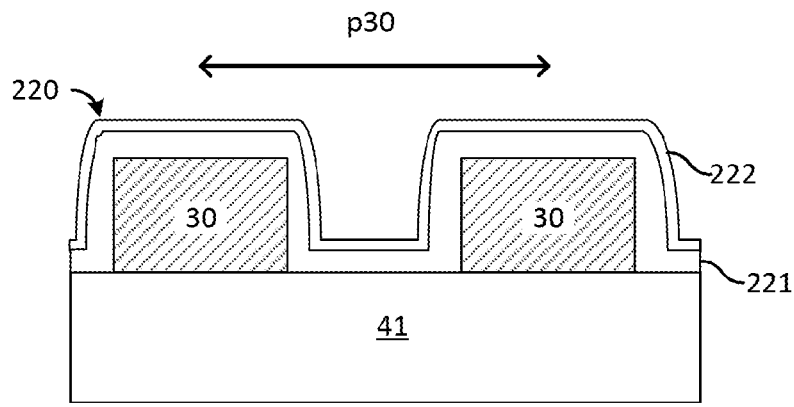
FIG. 4 illustrates a schematic cross-section of a patterned structure comprising a conformal BPSG film comprising the doped film and the undoped film formed using the embodiment of FIG. 2 in accordance with an embodiment of the present invention.

FIG. 4 illustrates a schematic cross section of a patterned structure comprising a conformal BPSG film 220 comprising the doped film 221 and the undoped film 222 formed using the embodiment of FIG. 2 in accordance with an embodiment of the present invention.

Referring to FIG. 4, a patterned structure 30 is formed over the substrate 41. As one illustration, the patterned structure 30 may be a gate line of a transistor. The distance between adjacent of the patterned structure 30 is the pitch p30. The ability to form conformal structures over the patterned structure 30 is critical to forming a plurality of patterned structure 30 at a narrow pitch.

Figure 5A:
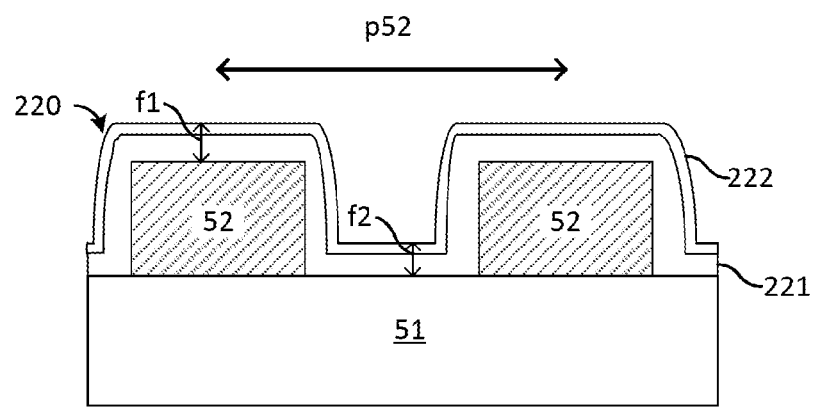
Figure 5B:
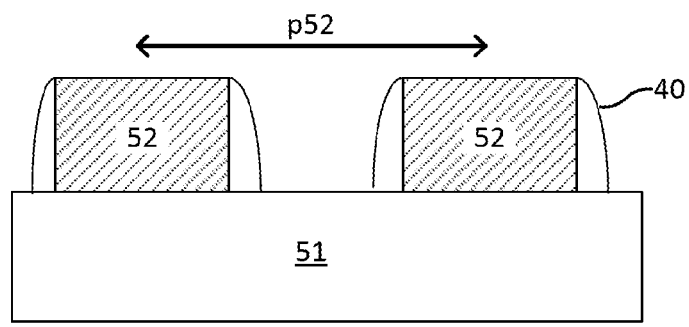

FIGS. 5A and 5B illustrate a schematic cross section of a patterned structure comprising a conformal BPSG film spacer formed using the embodiment of FIG. 2 in accordance with an embodiment of the present invention. FIG. 5A illustrates the conformal BPSG film while FIG. 5B illustrates the spacer.

Referring to FIG. 5A, a gate line 52 is formed over the substrate 51. A conformal BPSG film is formed over the gate line 52 using embodiments of the invention described in FIG. 2. See, example, FIG. 4 illustrating one such embodiment. The BPSG film may be etched using an anisotropic etch process. Because the BPSG film was previously formed conformally, an anisotropic etching process is sufficient to form the spacers. However, if the thickness at the bottom of the trench f2 is significantly larger than the thickness over the gate line 52, an anisotropic etching will open the gate line 52 and may etch at least a portion of the gate line 52 material. Advantageously, such issues are avoided by the use of the conformal BPSG film 220 as illustrated in FIG. 5B.

Figure 6:
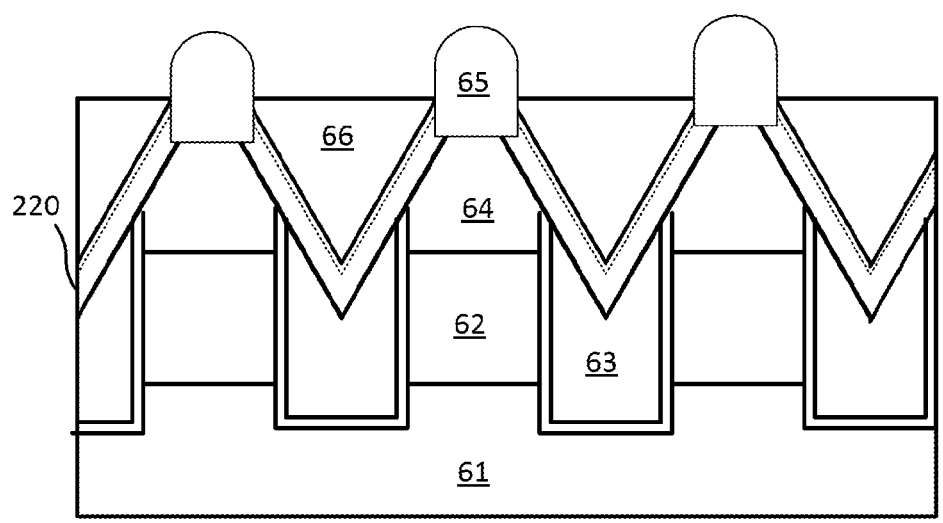
FIG. 6 illustrates a cross-sectional view of a semiconductor device comprising conformal BPSG film in accordance with an embodiment of the present invention.

FIG. 6 illustrates a cross-sectional view of a semiconductor device comprising conformal BPSG film 220 in accordance with an embodiment of the present invention.

Referring to FIG. 6, a plurality of trench gates 63 is disposed in a substrate 61. The transistor comprises a plurality of source regions 64 coupled to a plurality of contact pads 65 and a common drain region formed in the substrate 61. A channel region 62 separates the source regions 64 from the drain regions (substrate 61). The ability of forming conformal BPSG films 220 having less reflow but with good gettering and minimal change in etch process complexity enables the ease of producing such structures.

Figure 7A:
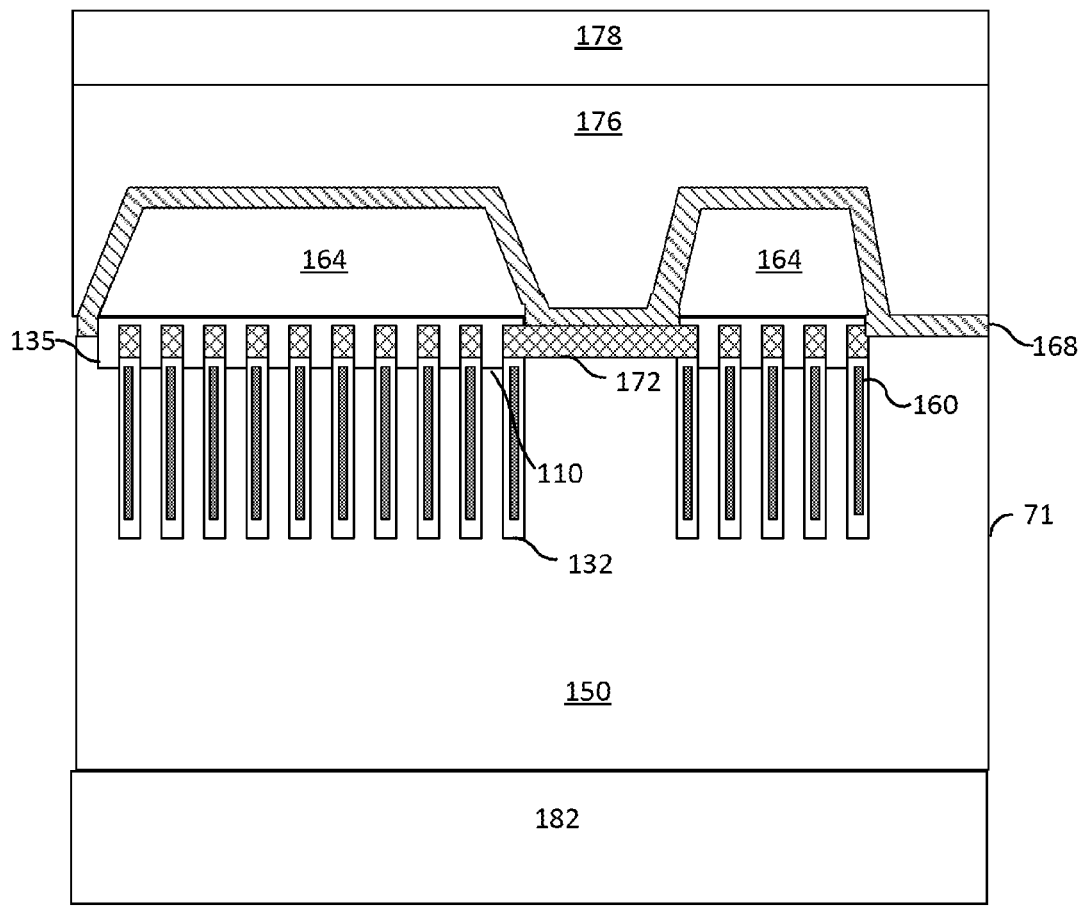
FIG. 7A illustrates a schematic cross section of a vertical transistor array in accordance with embodiments of the present invention and FIG. 7B illustrates one exemplary embodiment of a vertical transistor.
Figure 7B:
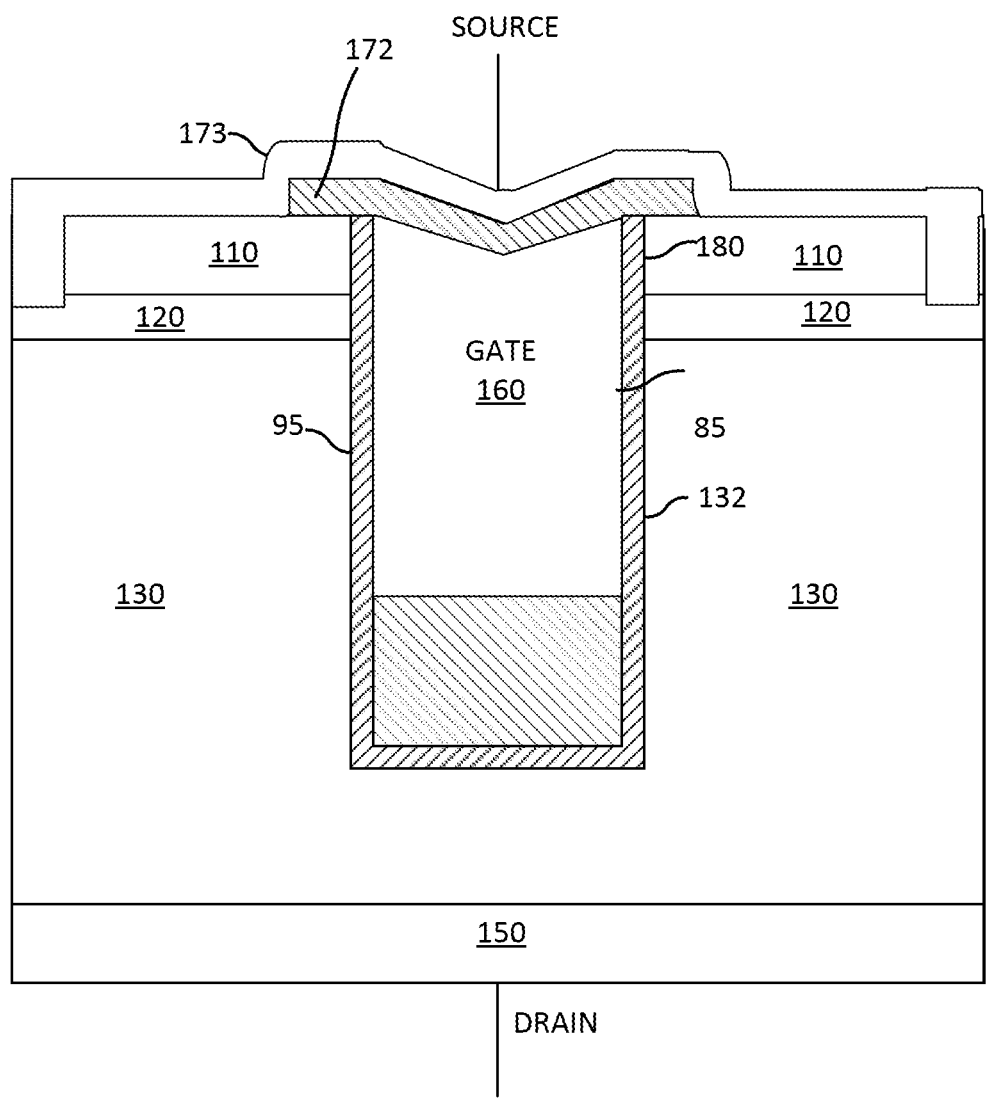

FIG. 7A illustrates a schematic cross section of a vertical transistor array in accordance with embodiments of the present invention and FIG. 7B illustrates one exemplary embodiment of a vertical transistor.

In one or more embodiments, the transistor may include a large number of trenches 132 in which gate lines 160 are formed. In various embodiments, there may be a larger number of gate lines 160 than illustrated. For example, some embodiments may include 1000-10,000 gate lines. Alternatively, in one embodiment, the plurality of gate lines 160 may be formed over the substrate 71. The plurality of gate lines 160 are coupled to upper metal lines through contacts (not shown).

Gate lines 160 are separated from source 164 by insulation material 172, which may be formed as conformal borophosphosilicate glass (BPSG) film as described above in various embodiments using primary and secondary deposition processes. During the secondary deposition processes, the termination of the deposition is adjusted to minimize the reflow of the BPSG layer.

Doped regions including source regions 110 are formed below source 164. In different embodiments, doped regions may be p-type or n-type doped regions and may also include both doped p- or n-wells and higher doped n+ or p+ regions inside the wells, depending on the well and semiconductor dopants. Referring to FIG. 7A, a plurality of sources regions 110 are embedded within the substrate 71. In case of n-channel field effect transistors, the plurality of sources regions 110 is formed of n-type regions. In case of p-channel field effect transistors, the plurality of sources regions 110 is formed of p-type regions.

Drain 150 is formed at a back side of the semiconductor substrate 71. A thick back side metal layer 182 is formed on the back side of the semiconductor substrate 71 for the drain contact.

The source 164 is coupled to the corresponding source regions through a metallic layer 135 in the substrate 71. In one or more embodiments, the metallic layer 135 may comprise a titanium/titanium nitride metal barrier liner stack followed by a tungsten fill layer. The metallic layer 135 may be selected to provide a good contact to the source regions 110 and minimize Schottky contact resistance. The source 164 may comprise aluminum in one or more embodiments. However, in some embodiments, the source 164 may comprise copper.

An inter-level insulating dielectric layer 168 is formed over the source 164. In various embodiments, the inter-level insulating dielectric layer 168 may comprise silicon oxide, silicon nitride, and other suitable inter level dielectric materials.

A metal level layer 176 is formed over the inter-level insulating dielectric layer 168. In various embodiments, the metal level layer 176 may comprise copper metal lines. A passivation layer 178 is formed over the metal level layer 176. In various embodiments, the passivation layer 178 may include a silicon oxide layer and is designed to protect the underlying metallization and devices.

This illustrated embodiment is one type of trench gate vertical transistor. In still further alternative embodiments, any type of power transistor with any type of structure may be used. In some embodiments, the transistor may also include an additional electrode underneath the gate line 160. However, the additional electrode may be electrically coupled to either the gate line itself or to the source 164 so that the load transistor is a three terminal device.

Referring to FIG. 7B, the plurality of gate lines 160 is capacitively coupled to the body regions 120 through a gate dielectric layer 95. The body regions 120, which form the channel regions, are lower doped regions that are opposite in net doping to the plurality of sources regions 110. Further, the gate dielectric layer 95 may comprise an oxide or nitride layer such as silicon oxide or silicon nitride. In one embodiment, the gate dielectric layer 95 comprises thermal silicon oxide layer. Alternatively, the gate dielectric layer 95 may comprise a high-k dielectric layer.

The gate dielectric layer 95 may comprise a suitable material selected based on the substrate material of the substrate 15 in various embodiments. For example, when the semiconductor substrate material of the substrate 15 comprises gallium nitride (GaN), the gate dielectric layer 95 may comprise aluminum oxide, scanadium oxide, magnesium oxide, titanium oxide, hafnium oxide, gadolinium oxide, lanthanum oxide, zirconium oxide, gallium oxide, gallium oxynitride, silicon nitride, silicon oxide, and others.

In one or more embodiments, the body region 120 may be coupled to the source metal. The plurality of gate lines 160 may be covered by an insulation material 172. A drift region 130 is disposed below the body region 120. The drift region 130 has the same net doping type as the source regions 110 in various embodiments. The drift region 130 is however a lower doped region than the source regions 110 so as to cause a potential drop across. The voltage drop across the drift region 130 prevents breakdown or damage of the gate dielectric layer 95.

As described above, advantageously, the reflow of the BPSG film is changed by changing the termination process of the SA-CVD process. Such a change is cost efficient as it does not incur or require any significant change in other processes.

Although embodiments of the present invention have been applied to the deposition of a BPSG film, in other embodiments may be applied to other types of glasses such as phosphosilicate glass (PSG), borosilicate glass (BSG), arsenic-silicon glass (AsSG), or similar films. For example, a PSG film may be deposited using a primary deposition process followed by a secondary deposition process in which the phosphorus source is shut-off or reduced as described in various embodiments above.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for depositing an insulating layer, the method comprising:
    performing a primary deposition over a first sidewall of a feature and a second sidewall of the feature by depositing a layer of silicate glass using a silicon source at a first flow rate and a dopant source at a second flow rate, wherein a ratio of the flow of the dopant source to the flow of the silicon source is a first ratio, wherein the second sidewall faces the first sidewall, and wherein the first sidewall intersects with the second sidewall at acute vertices and the feature comprises a trench gate disposed in a substrate, a common drain in the substrate, and a source region coupled to a contact pad;
    performing a secondary deposition over the first sidewall of the feature by increasing the flow of the silicon source relative to the flow of the dopant source, wherein the ratio of the flow of the dopant source to the flow of the silicon source is a second ratio lower than the first ratio;
    stopping the flow of the silicon source after performing the secondary deposition; and
    performing a reflow process after stopping the flow, wherein, after the reflow process, a variation in thickness of the layer of silicate glass at the acute vertices and other regions of the layer of silicate glass over the sidewall is between 0.1% to 10%, wherein the first sidewall and the second sidewall contact the trench gate, wherein the first sidewall intersects with the second sidewall at an angle less than 60° inside the trench.

2. The method of claim 1, wherein the primary deposition is performed for a first time duration and the secondary deposition is performed for a second time duration, wherein the second time duration is less than the first time duration, wherein the first time duration is between 8 s to 300 s, and wherein the second time duration is greater than 3 s.

3. The method of claim 1, wherein the layer of silicate glass after the primary deposition is at least 10 nm, and wherein an additional glass layer is deposited during the secondary deposition, wherein the additional glass layer comprises a thickness between 1 nm to 10 nm.

4. The method of claim 1, wherein increasing the flow during the secondary deposition comprises reducing the flow of the dopant source.

5. The method of claim 1, wherein increasing the flow during the secondary deposition comprises stopping the dopant source.

6. A method for depositing an insulating layer, the method comprising:
    performing a primary deposition by depositing a layer of silicate glass using a silicon source at a first flow rate and a dopant source at a second flow rate, wherein a ratio of the flow of the dopant source to the flow of the silicon source is a first ratio;
    performing a secondary deposition by increasing the flow of the silicon source relative to the flow of the dopant source, wherein the ratio of the flow of the dopant source to the flow of the silicon source is a second ratio lower than the first ratio, wherein the primary deposition is performed for a first time duration and the secondary deposition is performed for a second time duration, wherein the second time duration is less than the first time duration, wherein the first time duration is between 8 s to 300 s, and wherein the second time duration is greater than 3 s; and
    stopping the flow of the silicon source after performing the secondary deposition; and
    performing a reflow anneal, wherein the insulating layer is deposited on a textured surface comprising ridges intersecting at an angle between 30° to 60° with acute vertices, wherein the ridges contact a trench gate disposed in a substrate inside the trench, and wherein, after the reflow anneal, a thickness of the insulating layer at the acute vertices and a thickness of the insulating layer at other regions over the textured surface varies between 0.1% to 10%.

7. The method of claim 6, wherein the silicate glass comprises borophosphosilicate glass (BPSG).

8. The method of claim 6, wherein the primary deposition is performed for a duration between 40 s to 100 s and wherein the secondary deposition is performed for a duration between 4 s to 10 s.

9. The method of claim 6, wherein the primary deposition is performed for 50 s and wherein the secondary deposition is performed for at least 3 s.

10. The method of claim 6, wherein the layer of silicate glass after the primary deposition is at least 10 nm, and wherein an additional glass layer is deposited during the secondary deposition, wherein the additional glass layer comprises a thickness between 1 nm to 10 nm.

11. The method of claim 6, wherein increasing the flow during the secondary deposition comprises reducing the flow of the dopant source.

12. The method of claim 6, wherein increasing the flow during the secondary deposition comprises stopping the dopant source.

13. The method of claim 6, wherein increasing the flow during the secondary deposition comprises increasing the flow of the silicon source.

14. The method of claim 6, wherein the dopant source comprises triethylborate (TEB) or trimethylborate (TMB).

15. The method of claim 6, wherein the dopant source comprises one or more of triethylphosphate (TEPO), triethylphosphite ($TEP_i$), trimethylphosphate (TMOP), trimethylphosphite ($TMP_i$).

16. The method of claim 6, wherein the silicon source comprises tetraethylorthosilane (TEOS).

17. The method of claim 6, wherein the silicon source comprises silane.

18. The method of claim 6, wherein depositing the layer of silicate glass further comprising flowing an oxidizing gas and a carrier gas.

19. A method for forming a borophosphosilicate glass (BPSG) film, the method comprising:
    depositing a layer of BPSG using tetraethylorthosilane (TEOS) and a first dopant source using a first process parameter set for a first process time, wherein a ratio of a flow of the first dopant source to a flow of the TEOS is a first ratio;
    increasing the flow of the TEOS relative to the flow of the first dopant source using a second parameter set for a second process time by reducing the flow of first dopant source by at least 50% and increasing the flow of TEOS by at least 10%, wherein the ratio of the flow of the first dopant source to the flow of the TEOS is a second ratio lower than the first ratio, wherein the second process time is less than the first process time, wherein the first process time is between 8 s to 300 s, and wherein the second process time is greater than 3 s;

stopping the deposition of the BPSG film after increasing the flow; and performing a reflow anneal, wherein the BPSG film is deposited on a textured surface comprising a top surface comprising ridges intersecting at an angle less than 60° with acute vertices, wherein the ridges contact a trench gate disposed in a substrate inside the trench, and wherein, after the reflow anneal, a variation in a thickness of the BPSG film over the top surface between the acute vertices and other regions of the BPSG film is between 0.1% to 10%.

20. The method of claim 19, wherein the first process time is between 40 s to 100 s, and wherein the second process time is between 4 s to 10 s.

21. The method of claim 19, further comprising using a second dopant source during the depositing of the layer of the BPSG, wherein the second dopant source is stopped during the increasing of the flow.

22. The method of claim 21, wherein the first dopant source comprises triethylborate (TEB) or trimethylborate (TMB), and wherein the second dopant source comprises one or more of triethylphosphate (TEPO), triethylphosphite ($TEP_i$), trimethylphosphate (TMOP), trimethylphosphite ($TMP_i$).

23. The method of claim 1, wherein the variation in thickness of the layer of silicate glass over the sidewall of the feature after the reflow process is between 1% to 10%.

24. The method of claim 1, wherein a thickness of the thickness of the layer of silicate glass at a bottom part of the sidewall is higher than a thickness of the layer of silicate glass at a top part of the sidewall.

* * * * *